US006667183B2

United States Patent
Levy

(10) Patent No.: US 6,667,183 B2
(45) Date of Patent: Dec. 23, 2003

(54) FABRICATING PHOTODETECTING INTEGRATED CIRCUITS WITH LOW CROSS TALK

(75) Inventor: Jeffrey M. Levy, Moshav Netofah (IL)

(73) Assignee: Tower Semicondcutor Ltd., Ramat Migdal (IL)

(*) Notice: Subject to any disclaimer, the term of this patent is extended or adjusted under 35 U.S.C. 154(b) by 87 days.

(21) Appl. No.: 09/940,990

(22) Filed: Aug. 27, 2001

(65) Prior Publication Data

US 2002/0005531 A1 Jan. 17, 2002

Related U.S. Application Data

(62) Division of application No. 09/312,030, filed on May 14, 1999, now Pat. No. 6,288,434.

(51) Int. Cl.[7] .............................................. H01L 21/00
(52) U.S. Cl. ............................ 438/22; 438/24; 438/30
(58) Field of Search .............................. 438/22, 24, 29, 438/30, 57, 708, 669

(56) References Cited

U.S. PATENT DOCUMENTS

| 5,336,919 A | 8/1994 | Toriyama | 257/435 |
|---|---|---|---|
| 5,523,609 A | 6/1996 | Fukusho | 257/435 |
| 5,543,635 A | 8/1996 | Nguyen et al. | 257/66 |
| 5,600,165 A | 2/1997 | Tsukamoto et al. | 257/323 |
| 5,929,470 A | 7/1999 | Harada et al. | 257/233 |
| 5,976,908 A | * 11/1999 | Kwon et al. | 438/69 |
| 5,990,558 A | 11/1999 | Tran | 257/759 |
| 6,013,569 A | 1/2000 | Lur et al. | 438/595 |
| 6,049,114 A | 4/2000 | Maiti et al. | 257/412 |
| 6,124,177 A | 9/2000 | Lin et al. | 438/305 |
| 6,133,619 A | 10/2000 | Sahota et al. | 257/649 |

* cited by examiner

Primary Examiner—Caridad Everhart
(74) Attorney, Agent, or Firm—Bever, Hoffman & Harms, LLP; E. Eric Hoffman

(57) ABSTRACT

An anti-reflective layer is formed on the sidewalls of metal interconnects in an integrated circuit containing photodetector devices. After fabricating the photodetector devices, the metal interconnects are formed. An anti-reflective layer is formed over the interconnects and is directionally etched so that a portion of the anti-reflective layer remains covering the interconnect sidewalls, thereby reducing optical crosstalk in the photodetector devices due to sidewall reflection.

7 Claims, 3 Drawing Sheets

FABRICATING PHOTODETECTING INTEGRATED CIRCUITS WITH LOW CROSS TALK

RELATED APPLICATIONS

This application is a divisional application of U.S. patent application Ser. No. 09/312,030, entitled "Photodetecting Integrated Circuits With Low Cross Talk," filed May 14, 1999, by Jeffrey M. Levy, now U.S. Pat. No. 6,288,434 which is incorporated herein by reference.

BACKGROUND

1. Field of the Invention

The present invention relates to integrated circuits and in particular to reducing cross-talk in integrated circuits containing photodetector devices.

2. Related Art

Integrated circuits (ICs) designed as image sensors containing a photodetector device array typically suffer from cross-talk. In a typical image sensor IC, electromagnetic radiation in the visible and/or non-visible spectra enters the IC's top surface above a specific underlying photodetector device used to control a specific pixel in a pixel array used to represent a picture. Cross-talk occurs when radiation entering above one particular photodetector device is reflected or refracted within the IC structure. The reflected or refracted radiation is detected by an another photodetector device, thus causing picture distortion.

IC image sensors typically contain high quality charge coupled devices (CCDs). But it is known that even "studio quality" CCDs are susceptible to cross-talk. CMOS optical sensors currently under development may provide an enhanced "studio quality" image over images produced by present CCDs, in which case greater reduction in cross-talk will be necessary.

Cross-talk may be measured by providing a mask over a photodetector device array that allows radiation (e.g., light) to enter the IC over only one underlying device. The nearby device response is then measured and a ratio of intended versus non-intended detection is calculated. Informal industry comments have reported as high as twenty-five percent non-intended response.

FIG. 1 is a cross-sectional view of a portion of a conventional integrated circuit (IC) including a photodetector device. Cross sections of two conventional conductive interconnects 2A and 2B are depicted, along with a cross section of photodetector device 4. Radiation 6 is incident on device 4 from above.

As shown, device 4 is a conventional buried-channel charge coupled image sensor formed in a region of substrate 8 bounded by dashed lines 9 and including transparent conductive gate electrode 10 overlying doped channel layer 12. A conventional transparent insulating layer 14 overlies substrate 8 and device 4 formed in region 9.

Also shown are conventional patterned conductive interconnects 2A and 2B, each having the same cross-sectional structure. For interconnect 2A, a conventional patterned barrier metal layer 16A overlies substrate 8. Barrier layer 16A, as is known in the art, is typically an 800 angstrom thick titanium nitride (TiN) layer and prevents spiking and electromigration.

A conventional patterned conductive layer 18A, such as aluminum or aluminum alloy, is shown overlying barrier layer 16A. Layer 18A interconnects circuit devices in the IC, such as device 4. As depicted, sidewall 20A of interconnect layer 18A reflects radiation in the visible spectrum and also in wavelengths above and below the visible spectrum.

If interconnect layer 18A is formed of aluminum, for example, aluminum's current-carrying capability dictates that the thickness of layer 18A be at least 0.4 to 1.0 micrometers. Thus the reflective area of sidewall 20A cannot be reduced by using a layer 18A thickness less than approximately 0.4 micrometers.

FIG. 1 also shows a conventional patterned anti-reflective layer 22A on interconnect layer 18A. Layer 22A is typically TiN, and is formed during conventional photolithography processes. The reflective top surface of, for example, an aluminum layer may interfere with masking and exposing a photoresist layer (not shown) used during photolithography to pattern an interconnect. Therefore conventional photolithographic processes apply an anti-reflective layer on such a reflective surface before applying, masking, and exposing a photoresist layer. As shown, anti-reflective layer 22A remains on layer 18A after a conventional etch forms interconnect 2A.

As FIG. 1 shows, interconnect 2B has the same cross-sectional structure as interconnect 2A. Thus layers 16B, 18B, and 22B in interconnect 2B are the same as layers 16A, 18A, and 22A, respectively, in interconnect 2A. Similarly, layer 18B's sidewall 20B is analogous to layer 18A's sidewall 20A.

A known major optical cross-talk source is light or other radiation reflected from metal interconnect sidewalls within the IC, such as sidewalls 20A and 20B shown in FIG. 1. One present method used to reduce sensor cross-talk is to form a lens matrix overlying photodetector devices such as device 4. Each unique lens in the matrix focuses incident light onto a corresponding unique device in an underlying detection device matrix. However, such a lens matrix does not address the effects of light reflected from metal interconnects or other reflective surfaces in an IC. Furthermore, dark current—current flowing in a photodetector in the absence of irradiation—may provide a photon source as well. Some dark current-emitted photons may be reflected from the metal interconnect sidewalls to be sensed by photodetectors in the IC.

What is required is a way to further reduce cross-talk.

SUMMARY

In accordance with this invention, an anti-reflective layer is provided on the reflective top and sidewall surfaces of integrated circuit (IC) conductive interconnects. This anti-reflective layer which covers the reflective interconnect surfaces reduces optical cross-talk in the underlying photodetector devices formed in the IC.

A conventional barrier layer is formed over a substrate in which photodetector devices have already been fabricated. A conventional conductive metal layer, typically aluminum or an aluminum alloy, is formed on the barrier layer, and a conventional anti-reflective layer is formed on the top surface of the conductive metal layer. This anti-reflective layer is typically titanium nitride, and is used during conventional photolithographic processing to assist patterning the metal layer to form interconnects. Some embodiments of the invention may omit this anti-reflective layer.

A second anti-reflective layer is formed on the first anti-reflective layer. The second anti-reflective layer is, e.g., titanium nitride, tungsten, tungsten silicide, or other material having anti-reflective properties. After the second anti-reflective layer is formed, the stack comprising the barrier layer, the conductive layer, and the first and second anti-reflective layers is conventionally patterned and etched to define interconnect lines connecting devices in the IC.

Following the etch defining interconnect lines, a third anti-reflective layer is formed over the interconnect lines. Similar to the second anti-reflective layer, the third anti-reflective layer is, e.g., titanium nitride, tungsten, tungsten silicide, or other material having anti-reflective properties. After the third anti-reflective layer is formed, a directional etch is performed to enable incident radiation to reach the underlying photodetector devices in the IC. The directional etch removes a portion of the third anti-reflective layer from the top surface of the interconnect lines as well, but does not remove significant portions of the third anti-reflective layer covering the interconnect sidewalls. Thus each reflective sidewall surface of the conductive layer in the interconnects is covered by an anti-reflective layer. The anti-reflective layer process may be repeated for each of multiple layers of interconnect lines.

DETAILED DESCRIPTION

In accordance with embodiments of the present invention, a layer of anti-reflective material is formed on integrated circuit (IC) interconnect reflective sidewalls. The resulting structure reduces cross-talk among detector devices fabricated in the IC.

Identically numbered elements in the accompanying drawings represent similar structures. In addition, the accompanying figures are drawn to illustrate embodiments of the invention and do not conform to a particular vertical or horizontal scale.

Figure 1:
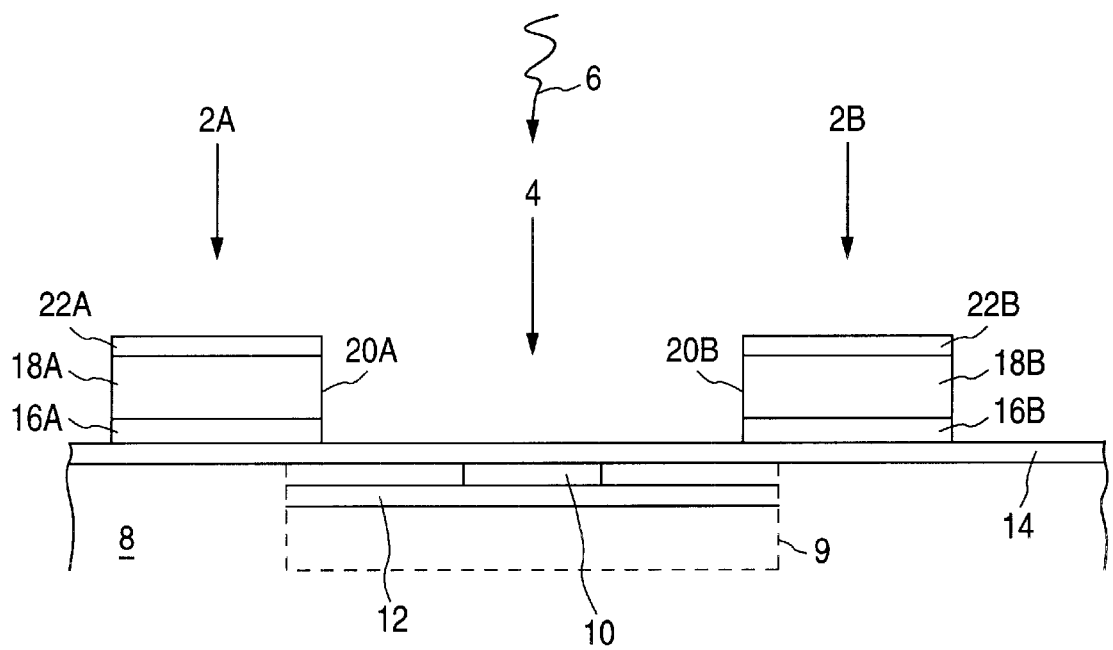
FIG. 1 is a cross-sectional view of a portion of an integrated circuit showing a typical photodetector device and conventional patterned metal interconnects.
Figure 2A:
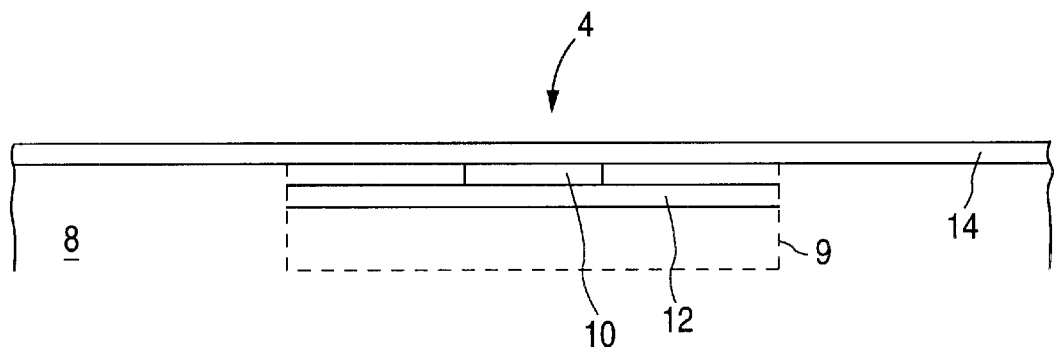
FIGS. 2A–2H are cross-sectional views showing the sequential formation of an embodiment of the invention.

FIG. 2A is a cross section view showing a portion of a processed semiconductor wafer. As shown, a typical buried-channel charge coupled image sensor device 4 is formed in a region of substrate 8 bounded by dashed line 9, as described in relation to FIG. 1. In other embodiments of the invention, device 4 may be another type of photodetector device, such as a CMOS image sensor, configured to detect radiation either in the visible or non-visible spectrums. For clarity, other drawings do not show representative cross sections of device 4, but it is understood that a photodetector device is formed in a region of substrate 8 bounded by dashed line 9. As shown, transparent dielectric layer 14 overlies substrate 8 and the photodetector region bounded by dashed line 9. In one embodiment layer 14 is of borophosphorous silicate glass. In other embodiments other materials may be used to form layer 14.

Figure 2B:
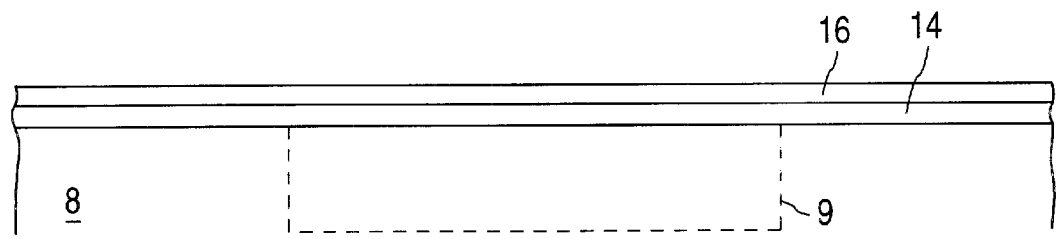
Figure 2C:
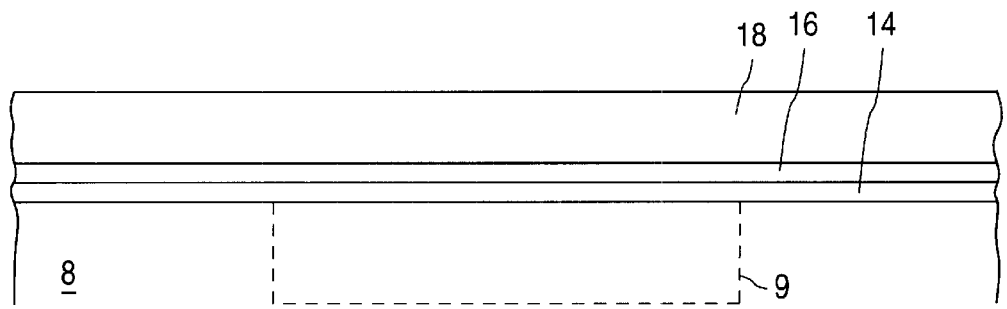

FIG. 2B shows a conventional titanium nitride (TiN) barrier layer 16 deposited over substrate 8. As described in relation to FIG. 1, barrier layer 16 is approximately 800 angstroms thick although other thicknesses may be used. FIG. 2C shows a conventional conductive aluminum layer 18 formed on barrier layer 16. In other embodiments, layer 18 is formed of another conventional conductor such as an aluminum alloy or other material having a reflective sidewall when patterned. As described above, layer 18 is, e.g., approximately 4,000 to 10,000 angstroms (0.4 to 1.0 micrometers) thick in embodiments using aluminum. Some embodiments of this invention may be used where layer 18 is formed of other conductive material such as doped polycrystalline silicon.

Figure 2D:
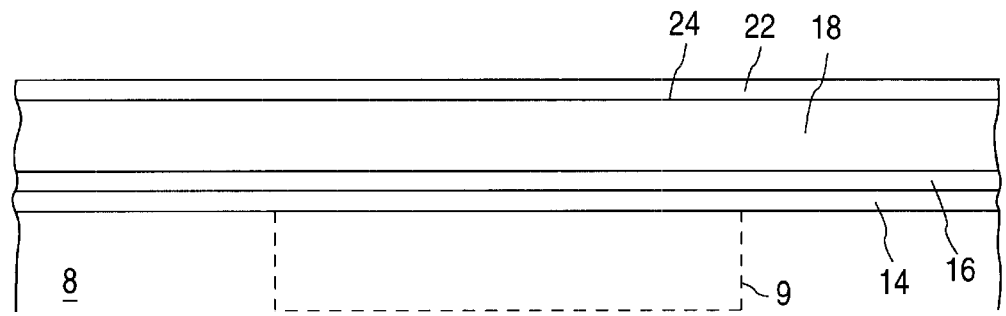

FIG. 2D shows a conventional anti-reflective layer 22 formed on layer 18. As described above, layer 22 is formed to prevent the reflective top surface 24 of layer 18 from interfering with subsequent conventional photolithographic patterning. Layer 22 may be omitted because later another anti-reflective layer is formed over aluminum layer 18, as described below. However, the conventional etch process for patterning aluminum having an overlying TiN layer is well-known and stabilized. Eliminating anti-reflective layer 22 changes these known conventional photolithography and etch procedures, and therefore some embodiments retain layer 22.

Figure 2E:
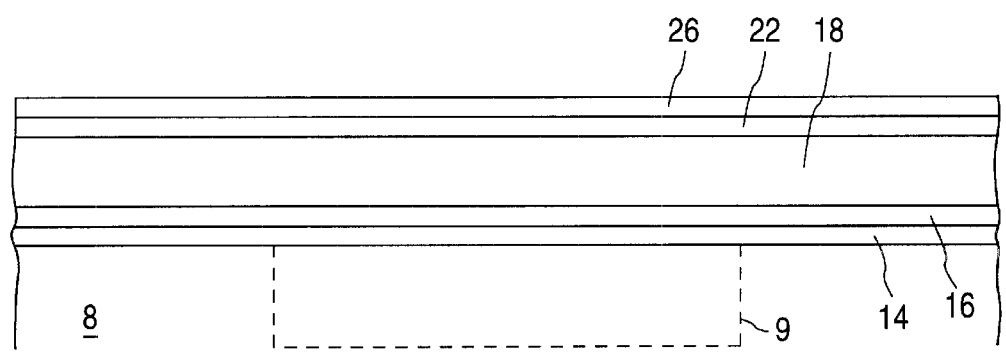

In accordance with the invention, a second anti-reflective layer 26 is formed over layer 22 as shown in FIG. 2E. Anti-reflective layer 26 is formed of titanium nitride, tungsten, tungsten silicide, or other material having low reflectivity in either the visible or non-visible spectra. Among these materials, tungsten provides the best anti-reflective properties. The tungsten is deposited using conventional chemical vapor deposition techniques. Tungsten may be used to create integrated circuit sensors capable of producing "studio quality" images. Other embodiments use TiN to form layer 26 due to TiN's ease of fabrication compared to tungsten. TiN is deposited using conventional sputtering techniques. Layer 26 has a thickness in the range from a few hundred to a few thousand angstroms. Thicker layers provide increased anti-reflective properties, up to a few thousand angstroms. After layer 26 is formed, the conductive interconnects are patterned and formed using conventional photolithographic and metal etching procedures.

Figure 2F:
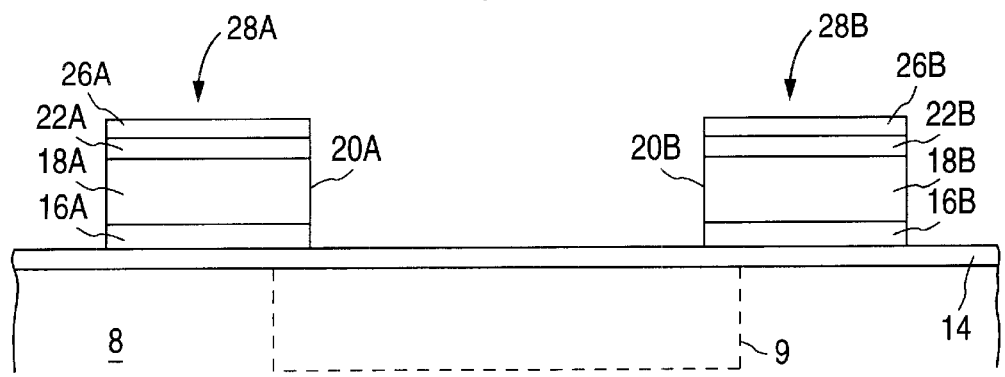

FIG. 2F shows a cross section of conductive interconnects 28A and 28B formed over substrate 8. The etch forming interconnects 28A and 28B may be performed using conventional equipment, such as a metal etched supplied by the Lam Research Corp. of Fremont, Calif. The etch forms sidewalls 20A and 20B, and exposes layer 14 overlying device 4 (FIGS. 1 and 2A).

Figure 2G:
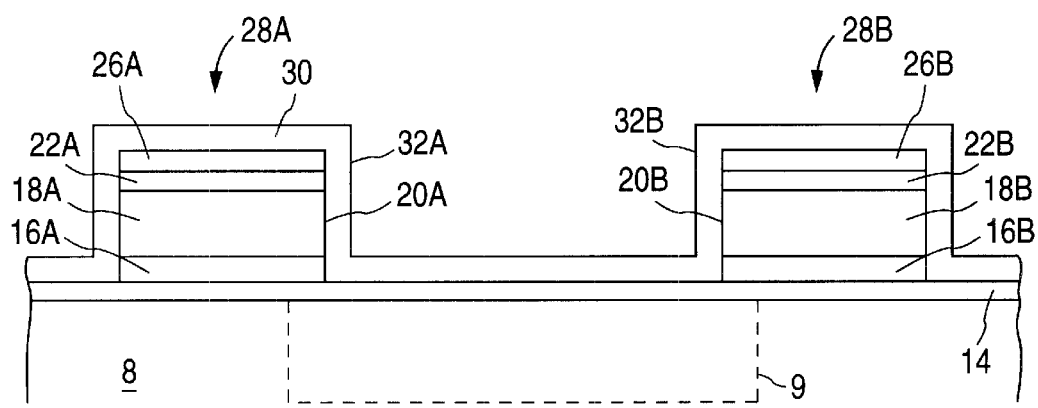

FIG. 2G shows another anti-reflective layer 30 formed over substrate 8 and covering interconnects 28A and 28B. As shown, anti-reflective layer 30 covers reflective sidewalls 20A and 20B of conductive layers 18A and 18B, respectively. As with anti-reflective layer 26, discussed above, anti-reflective layer 30 is formed of titanium nitride, tungsten, tungsten silicide, or other material having low reflectivity. The aspect ratio (depth:width) between typical IC interconnects, such as interconnects 28A and 28B shown here, is not high—typically less than 1:1. Thus conformal coverage of interconnects is based on conventional step coverage calculations. Sputtering, as used to deposit titanium nitride to form layer 30, gives reasonable coverage. Chemical vapor deposition, as used to deposit titanium to form layer 30, gives excellent coverage.

The thickness of layer 30 is sufficient to reduce the reflective quality of sidewalls 20A and 20B. As with anti-reflective layer 26, discussed above, the thickness of layer 30 may range from a few hundred to a few thousand angstroms. For ICs in which conductive interconnects are closely spaced, layer 30 must not be so thick as to fill the space between the interconnects if an underlying detector device is to be exposed during a subsequent etch in accordance with the invention, as discussed below. In other words, as shown in FIG. 2G, there must be sufficient space remaining between surfaces 32A and 32B after layer 30 is formed.

Figure 2H:
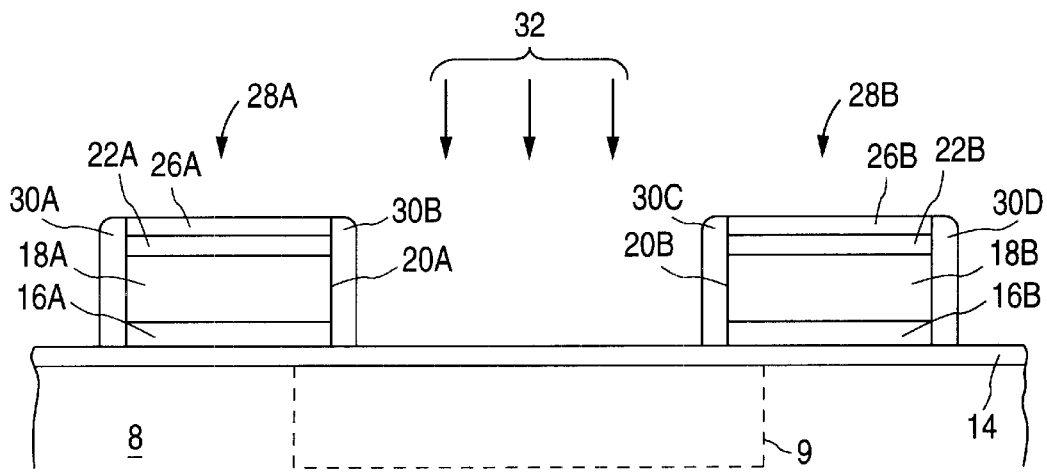

FIG. 2H shows the result of a final conventional etchback process. As shown, a directional (directionally preferential) dry metal etchback process, represented by arrows 32, is performed to remove a portion of layer 30 between interconnects 28A and 28B without substantially affecting those portions of layer 30 covering sidewalls 20A and 20B. In addition, portions of layer 30 formed on interconnects 28A and 28B are removed during this etch, but anti-reflective layers 26A and 26B remain. This etch is performed to remove portions of layer 30 so as to allow light 6 to reach device 4 during operation. As shown in this embodiment, layer 14 protects a photodetector device formed in the region bounded by dashed line 9.

Equipment used for this etchback of layer 30 may be the same as the equipment used to form interconnects 28A and 28B, described above in relation to FIG. 2F. The etch process needs to be adjusted for the circumstances, but any standard TiN or tungsten etch process may be used for etching back a TiN or tungsten layer, respectively. Etch time for large scale wafer processing is determined by detecting an end point signal, as is known in the semiconductor processing field. The etch process is monitored to determine the etch plasma's spectral response change when a different material, such as layer 14, is reached during etching. The etch time is then increased 15–20 percent for "clean up." In one embodiment using TiN to form layer 30, the etch is done using a Lam Research Corp. Model TCP 9600 at a pressure of 10 mTorr and RF power of 500 watts top and 220 watts bottom. $Cl_2$ is introduced at 60 standard cubic centimeters per minute (sccm) and $BCl_3$ at 40 sccm. For this embodiment, a 48 sec. etch time is used (40 sec. to etch, plus 8 sec. in addition).

As shown in FIG. 2H, portions 30A and 30B of layer 30 remain covering the sidewalls of interconnect 28A after the etch. Similarly, portions 30C and 30D of layer 30 remain covering the sidewalls of interconnect 28B after the etch. Thus, portion 30B covers and prevents reflection from reflective sidewall 20A and portion 30C covers and prevents reflection from reflective sidewall 20B.

Figure 3:
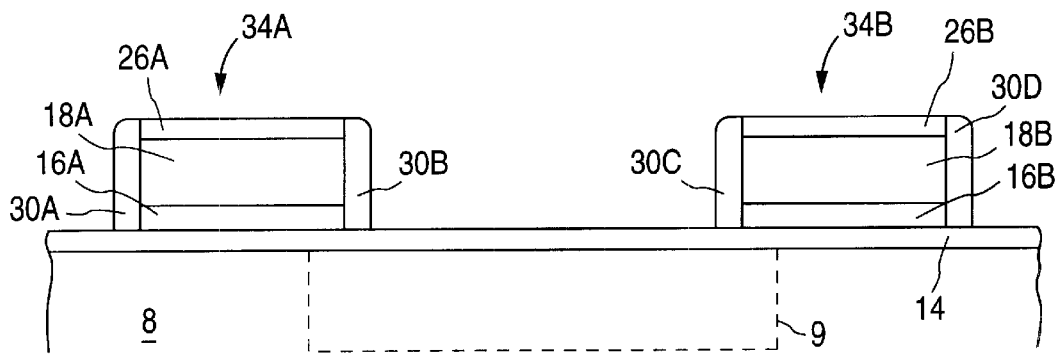
FIG. 3 is a cross-sectional view showing a second embodiment of the invention.

FIG. 3 shows a cross section of another embodiment of the invention. As depicted, the cross-sectional structure of interconnects 34A and 34B is the same as the cross-sectional structure of interconnects 28A and 28B shown in FIG. 2H, respectively, except that anti-reflective layers 22A and 22B are omitted. Therefore FIG. 3 shows the result of eliminating the formation of anti-reflective layer 26 during conventional photolithographic processing of reflective surfaces, as discussed above in relation to FIG. 2D. An advantage to omitting layer 26 is that a process step is eliminated.

After the anti-reflective layer is formed on the sidewalls of conductive interconnects in accordance with the present invention, standard wafer processing steps may be continued until a next conductive interconnect layer is required. The process as previously described may then be repeated to form an anti-reflective layer on the sidewalls of any subsequently formed conductive interconnects.

While the present invention has been described in terms of specific embodiments, those skilled in the art will appreciate that many modifications and variations exist that fall within the spirit and scope of the present invention.

I claim:

1. A method of forming an integrated circuit with reduced cross-talk, the method comprising:

providing a substrate having at least one radiation sensitive region formed therein;

forming a conductive layer over said substrate;

forming a first anti-reflective layer over said conductive layer;

patterning said first anti-reflective layer and said conductive layer to define an interconnect having a sidewall;

forming a second anti-reflective layer over said substrate, wherein said second layer directly contacts and covers said sidewall; and preferentially patterning said second anti-reflective layer so as to remove said second anti-reflective layer overlying said radiation sensitive region but leaving at least a part of said second anti-reflective layer covering said sidewall.

2. The method of claim 1 wherein said first and said second anti-reflective layers are of the same kind of material.

3. The method of claim 1 further comprising forming a third anti-reflective layer on said first anti-reflective layer before patterning said first anti-reflective layer and said conductive layer, and wherein patterning said first anti-reflective layer and said conductive layer to define an interconnect having a sidewall further comprises patterning said third anti-reflective layer.

4. The method of claims 3, wherein preferentially patterning said second anti-reflective layer comprises leaving said part of said second anti-reflective layer covering said side wall in contact with said patterned third anti-reflective layer on said defined interconnect.

5. The method of claim 1, wherein preferentially patterning said second anti-reflective layer comprises leaving said part of said second anti-reflective layer covering said side wall in contact with said patterned first anti-reflective layer on said defined interconnect.

6. The method of claim 1, wherein said sidewall is proximate said radiation sensitive region.

7. The method of claim 1, wherein the first anti-reflective layer is formed directly on the conductive layer.

* * * * *